United States Patent [19]
Hong

[11] Patent Number: 5,482,879
[45] Date of Patent: Jan. 9, 1996

[54] PROCESS OF FABRICATING SPLIT GATE FLASH MEMORY CELL

[75] Inventor: Gary Hong, Hsinchu, Taiwan

[73] Assignee: United Microelectronics Corporation, Hsinchu, Taiwan

[21] Appl. No.: 439,917

[22] Filed: May 12, 1995

[51] Int. Cl.$^6$ ............................................. H01L 21/8247
[52] U.S. Cl. .................... 437/43; 437/984; 257/316; 257/321
[58] Field of Search ............................. 437/43, 52, 984; 257/316, 321

[56] References Cited

U.S. PATENT DOCUMENTS

| | | | |
|---|---|---|---|
| 4,868,629 | 9/1989 | Eitan . | |
| 5,049,515 | 9/1991 | Tzeng | 437/43 |
| 5,063,172 | 11/1991 | Manley | 437/43 |
| 5,422,292 | 6/1995 | Hong et al. | 437/43 |
| 5,427,968 | 6/1995 | Hong | 437/43 |

OTHER PUBLICATIONS

Samachisa, Gheorge, et al. (1987) "A 128K Flash EEPROM Using Double–Polysilicon Technology", *IEEE J. Sold–State Circuits*, vol. SC–22, (5):676–683, Oct. 1987.

Primary Examiner—George Fourson
Assistant Examiner—Richard A. Booth
Attorney, Agent, or Firm—Townsend and Townsend and Crew

[57] ABSTRACT

A process of fabricating a split gate flash memory cell first forms a stacked-gate structure on a face of a substrate. The stacked-gate structure includes a tunnel oxide, a polysilicon floating gate, an inter-poly dielectric and a first polysilicon control gate. A drain region is formed into the substrate at one side of the stacked-gate structure, and is self-aligned with the stacked-gate structure. Thermal oxidation is performed to form sidewall oxides on the sidewalls of the stacked-gate structure, and gate oxide on the substrate. A second polysilicon control gate is deposited over the first polysilicon control gate, sidewall oxides and gate oxide, and is connected with the first polysilicon control gate to form a common control gate. A source region is formed in the substrate at another side of the stacked-gate structure, and is self-aligned with the substantially upright portion of the second polysilicon control gate located at the another side of the stacked-gate structure.

14 Claims, 5 Drawing Sheets

PROCESS OF FABRICATING SPLIT GATE FLASH MEMORY CELL

BACKGROUND OF THE INVENTION

The present invention relates to integrated circuit fabrication, and more particularly to a process of fabricating a split-gate flash memory cell, which utilizes self-aligned process to precisely define both channel lengths of the stacked-gate transistor and isolation transistor of a memory cell. As such, better controllability for manufacturing and high operating performance can be obtained.

Split-gate Flash EEPROMs are well-known nonvolatile memory ICs in this art, and have the advantages of preventing the leakage current caused by an over-erased cell, which increases the cell current drown. One split-gate flash EEPROM structure is disclosed in an article by Gheorghe Samachisa, et al. entitled "A 128K Flash EEPROM Using Double-Polysilicon Technology", published in *IEEE J. Solid-State Circuits*, Vol. SC-22, No. 5, pp. 676–683, October 1987. This prior split gate structure and its equivalent circuit are shown in FIGS. 1 through 3. FIG. 1 illustrates a schematic layout of a split gate memory cell, FIG. 2 illustrates a cross-section of the memory cell, and FIG. 3 illustrates an equivalent circuit diagram of the memory cell. As shown in FIGS. 1 and 2, a first polysilicon layer 12 acting as the floating gate is formed above a face of a P-type silicon substrate 1. A second polysilicon layer 14 is further deposited and patterned to form the control gate and the word lines in a memory array. A tunnel oxide 11 is formed between the floating gate 12, parts of the control gate 14 and the substrate 1. An interpoly dielectric 13 such as an oxide-nitride-oxide (ONO) structure is formed between the polysilicon gates 12 and 14. The $N^+$ diffusion region 15 adjacent to the right edge of the floating gate 12 is the drain, and the $N^+$ diffusion region 16 adjacent to the left edge of the control gate 14 is the source. The memory cell structure can be thought of as two transistors in series, especially referring to FIG. 3. One is a stacked-gate (floating-gate) memory transistor 20, and the other is an isolation transistor 22 which is a simple enhancement transistor controlled by the control gate 14, i.e. the word line. In FIG. 2, "$L_1$" indicates the channel length of the memory transistor 20, "$L_2$" the channel length of the enhancement transistor 22, and "L" the total channel length of the split gate flash memory cell.

As disclosed in the article, the purpose of the series enhancement transistor 22 in this flash EEPROM cell is to prevent the leakage current in a memory array during programming and/or reading caused by an over-erased cell. More specifically, unlike ultraviolet (UV) light erasing, electrical erasing is not self-limiting. Electrical erasing can (and usually does) leave the floating gate 12 positively charged, thus turning the memory cell 20 into a depletion-mode transistor. The series transistor 22 is needed to prevent current flow under this condition. The extra cell size added by the series enhancement transistor can also improve the cell current and programming characteristics even without considering the benefit of electrical erasability.

Although the split gate flash EEPROM has the above-described advantages, the memory cell structure of FIGS. 1 and 2 still has a drawback. That is, the process of fabricating the memory cell requires the use of photolithography technology to define the channel length $L_1$ of the memory transistor 20 as well as the channel length $L_2$ of the isolation transistor 22. Even though the total channel length $L=L_1+L_2$ is fixed, the channel lengths $L_1$ and $L_2$ must depend on the photolithography alignment between the polysilicon gates 12 and 14. This can lead to difficulty in precise control of the channel lengths $L_1$ and $L_2$. Thus, the operating performance of the split-gate flash memory may be significantly affected by processing misalignments.

Another split-gate flash memory cell structure is disclosed in U.S. Pat. No. 4,868,629, issued to B. Eitan on Sep. 19, 1989. FIG. 4 illustrates in cross section the split gate structure of this Patent. As shown in FIG. 4, a tunnel oxide 30 is formed on a P-type silicon substrate 3, and a patterned polycrystalline silicon 32 is formed on the tunnel oxide 30 to act as the floating gate. A photoresist layer 38 is then formed over the top surface of the structure, and is patterned to expose the planned source/drain areas, followed by an ion implantation to dope $N^{++}$ source 36 and drain 34 regions. The process of fabricating this split gate structure has the advantage of self-aligning the drain region 34 to one edge of the floating gate 32, but still has the drawback of uncertainty in the channel length of the isolation transistor and thus the total channel length of the memory cell, owing to difficulty in precise alignment of the intermediate photoresist part 38 to the floating gate 32. Thus, the operating performance of this split-gate flash memory may be significantly affected by processing misalignments.

SUMMARY OF THE INVENTION

The primary object of the present invention is to provide a split-gate flash memory cell process which substantially reduces or eliminates the above-described drawback associated with prior split gate structures. That is, the process of the present invention can more precisely define both channel lengths for memory and isolation transistors, resulting in better controllability for manufacturing. Also, the memory cell of the present invention will be more suitable for very-high-density flash memory applications.

In accordance with the present invention, a method for forming a split gate EEPROM cell including a memory transistor and an isolation transistor, comprises the steps of:

forming a stacked-gate structure for the memory transistor on a face of a substrate, the stacked-gate structure including a tunnel-insulating layer, a floating-gate layer, an inter-level dielectric layer and a first control gate layer;

forming, at one side of the stacked-gate structure, a diffused drain region into the substrate with one edge of the drain region aligned with the edge of the stacked-gate structure at said one side;

forming sidewall insulating layers on the sidewalls of the stacked-gate structure, and forming a gate-insulating layer for the isolation transistor on the substrate;

forming a second control gate layer over the first control gate layer, the sidewall-insulating layers and the gate-insulating layer, the second control gate layer connecting with the first control gate layer to form a common control gate for the memory and isolation transistors; and forming, at another side of the stacked-gate structure opposite to said one side, a diffused source region in the substrate with one edge of the source region aligned with one edge of a substantially upright portion of the second control gate layer, which is formed on the sidewall-insulating layer located at said another side of the stacked-gate structure.

In accordance with one aspect of the present invention, the formation of the sidewall- and gate-insulating layers includes the steps of forming an oxidation preventing layer on the first control gate; thermal oxidation to grow the sidewall- and gate-insulating layers; and removing the oxidation-preventing layer. The oxidation-preventing layer may be a silicon nitride layer.

In accordance with another aspect of the present invention, the formation of the drain region includes the steps of forming a mask layer to cover the planned source area and part of the stacked-gate structure and to expose the planned drain area; implanting by ions to form the drain region; and removing the mask layer.

BRIEF DESCRIPTION OF THE DRAWINGS

The present invention can be more fully understood by reference to the following description and accompanying drawings, which form an integral part of this application.

DETAILED DESCRIPTION OF THE PREFERRED EMBODIMENTS

The preferred embodiment of the present invention is illustrated in FIGS. 5(a) through 5(f) of the drawings, with like numerals being used to refer to like and corresponding parts of the various drawings. FIGS. 5(a)–5(f) illustrate cross-sectional side views of the present invention throughout various processing steps. It should be noted that the following detailed description is meant to be illustrative only and not limiting. Other embodiments of the present invention will be obvious to those skilled in the art in view of the following discussion.

Figure 1:
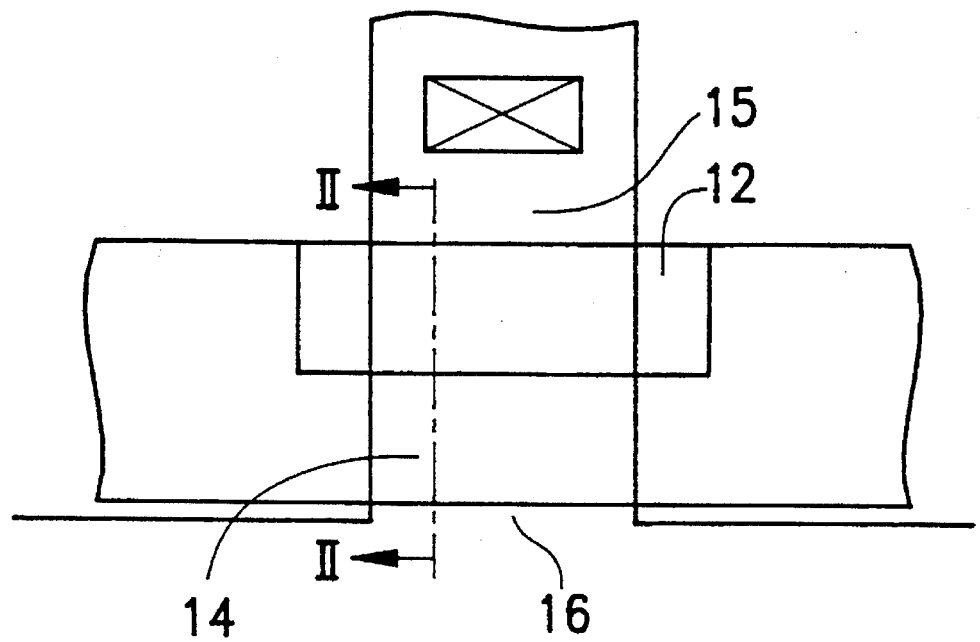
FIG. 1 illustrates a schematic layout of a split-gate flash memory cell structure of the prior art.
Figure 2:
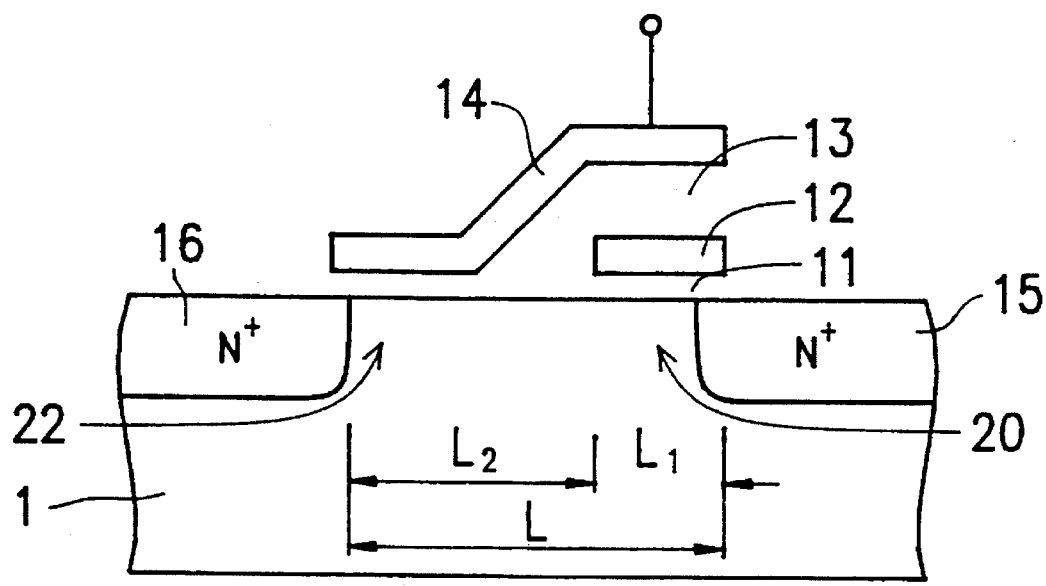
FIG. 2 illustrates a cross-sectional side view of the memory cell structure shown in FIG. 1, taken along the line II—II.
Figure 3:
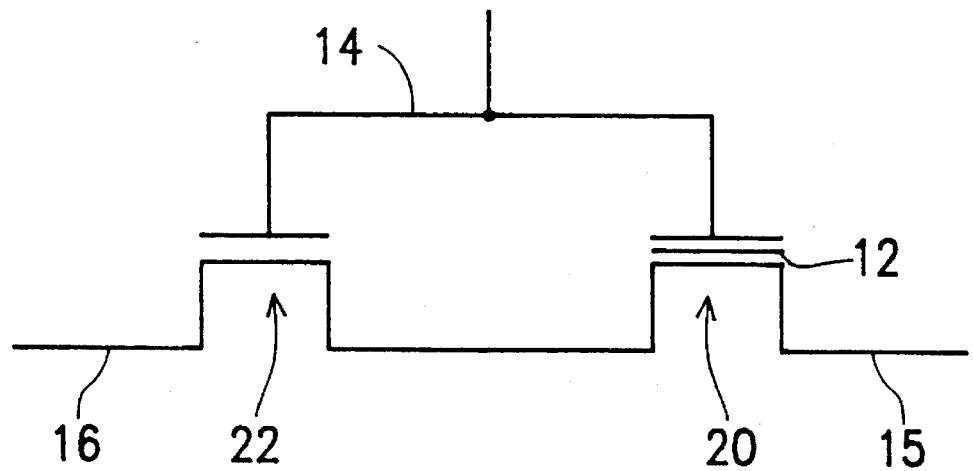
FIG. 3 illustrates an equivalent circuit diagram of the split-gate memory cell shown in FIG. 1.
Figure 4:
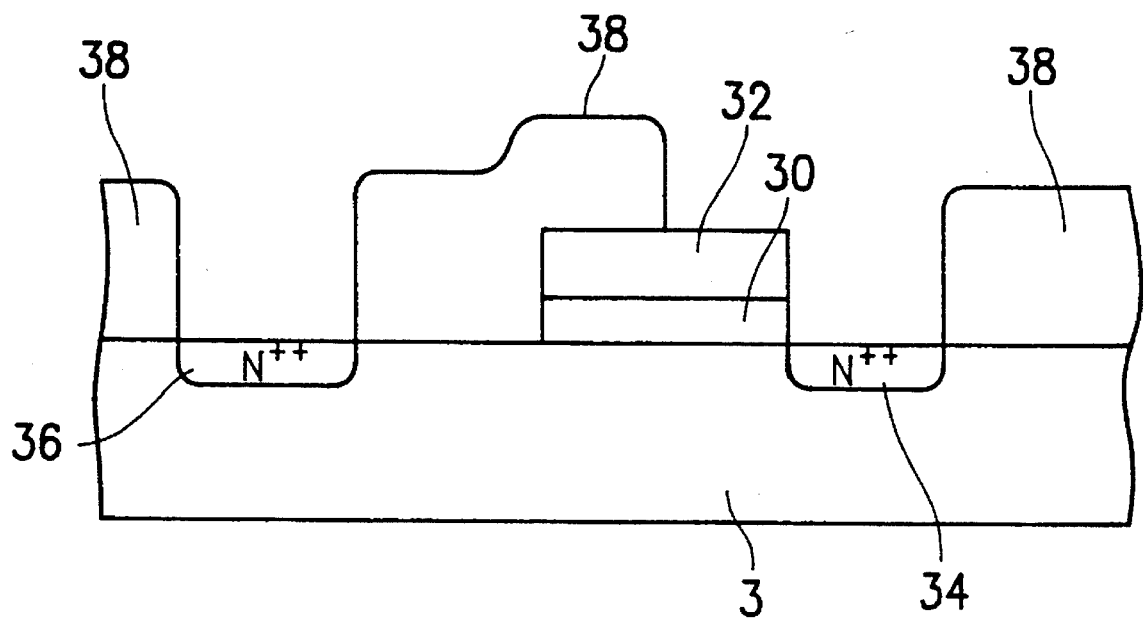
FIG. 4 illustrates a cross-sectional side view of another split-gate flash memory cell structure of the prior art wherein the floating gate is self-aligned with the drain region.
Figure 5A:
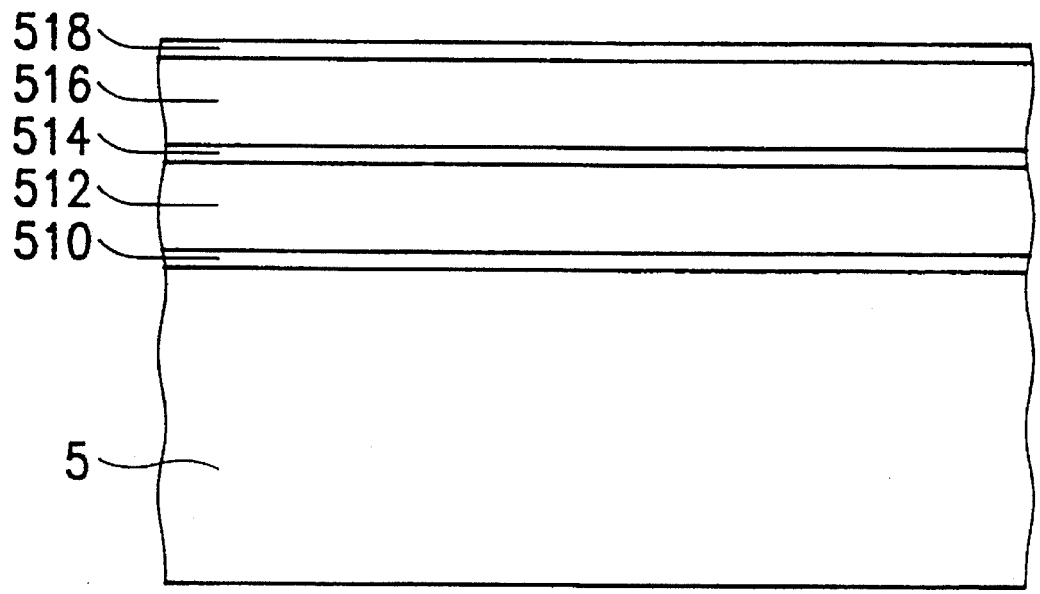
FIGS. 5(a) through 5(f) illustrate cross-sectional side views of a split-gate flash EEPROM cell in accordance with one preferred embodiment of the present invention, at various stages of fabrication.

Referring now to FIG. 5(a), there is shown a cross-sectional side view of a silicon substrate 5 after a first processing stage. The substrate 5 is lightly doped by dopant of N-type or P-type conductivity, depending on whether a P-channel or N-channel transistor device is being fabricated. In this embodiment, an N-channel device is fabricated exemplarily, and thus the substrate 5 is doped by P-type dopant for forming thereon split-gate flash EEPROM cells of the present invention, each including a stacked-gate memory transistor and an isolation transistor. A gate insulator 510 is formed along the surface of the silicon substrate 5, and typically comprises a tunnel oxide grown at a thickness of 60–100 angstroms. A first conductive layer 512 is deposited over the tunnel oxide 510. Typically, the first conductive layer 512 comprises a highly doped polysilicon layer, and its thickness is on the order of about 1000 angstroms. An inter-level dielectric layer 514 is formed over the first polysilicon layer 512. Typically, the interlevel dielectric layer 514 utilizes an ONO (oxide-nitride-oxide) structure. A second conductive layer 516, typically a highly doped polysilicon layer, is then deposited over the dielectric layer 514, and its thickness may be in the range of about 2000–4000 angstroms. A protection layer 518 such as silicon nitride is deposited over the second polysilicon layer 516, and its thickness may be in the range of about 200–1000 angstroms.

Figure 5B:
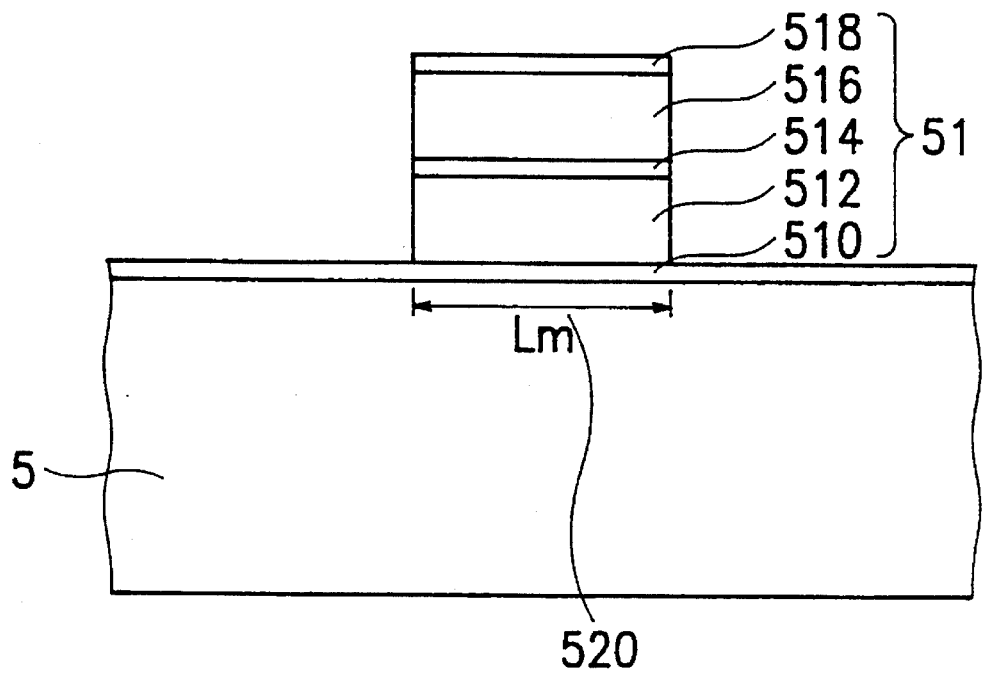

FIG. 5(b) illustrates a cross-sectional side view of the present invention after a second processing stage. The nitride layer 518, second polysilicon layer 516, inter-poly dielectric layer 514, and first polysilicon layer 512 are patterned to form a stacked-gate structure 5, typically by conventional photolithography and etching technologies. In the stacked-gate structure 51, the first polysilicon 512 forms the floating gate of the memory transistor, and the second polysilicon 516 forms the control gate. The silicon substrate region 520 underneath the stacked-gate structure 51 forms the channel of the memory transistor. The channel length $L_m$ of the memory transistor is defined in this processing stage, and is easily controllable without any misalignment problems.

Figure 5C:
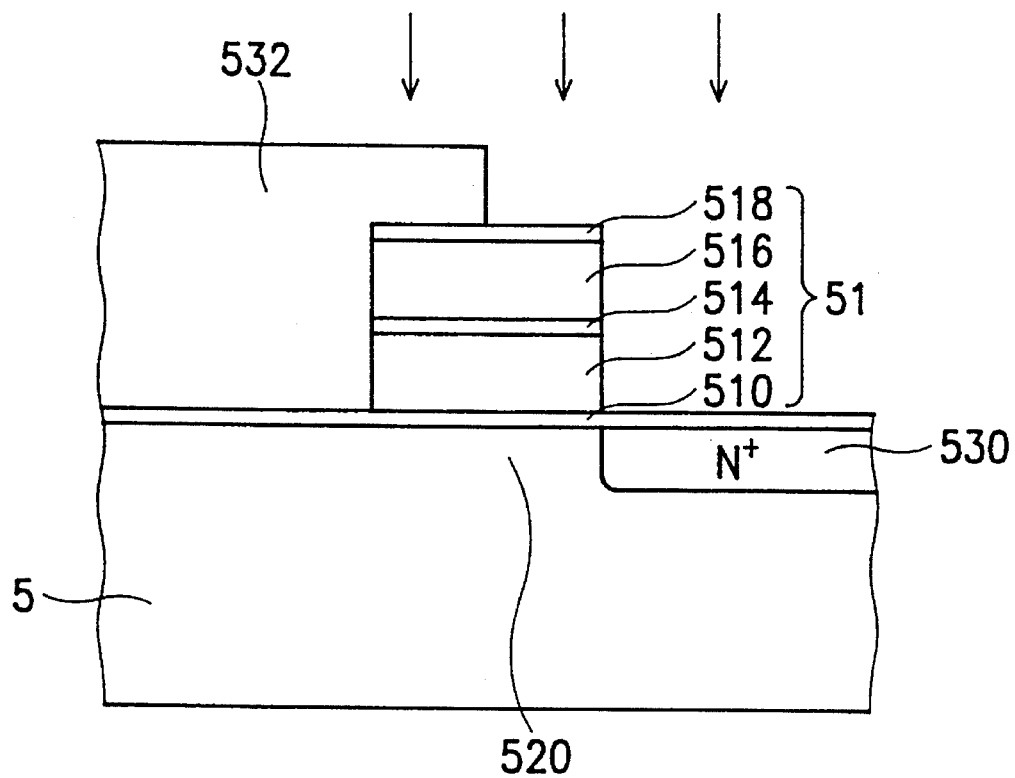

FIG. 5(c) illustrates a cross-sectional side view of the present invention after a third processing stage. A photoresist layer is then formed over the top surface of the structure, and is patterned so that the residual photoresistor 532 partially overlies the stacked-gate structure 51 and exposes the planned drain area. The right edge of the photoresistor 532 may be formed to overlie the stacked-gate structure 51 somewhere near its middle. Since the stacked-gate structure 51 typically has a length of 1.5 to 2 microns, it is not difficult to ensure with sufficient certainty given typical tolerances in manufacturing process that the right edge of photoresistor 532 is to the left of the right edge of stacked-gate structure 51 even for a reasonably expected worst-case mask misalignment during the manufacturing process. Following the formation of patterned photoresistor 532, the structure is subjected to an ion implantation to form $N^+$ drain region 530, typically by use of arsenic ions at a dosage of about $3\times10^{15}$ atoms/cm$^2$ and with an energy of about 50 KeV. The use of arsenic as a dopant is merely exemplary, and it is to be understood that alternative dopants known in the art may be utilized. The formed drain region 530 has its left edge defined by the right edge of stacked-gate structure 51, and thus is self-aligned with the right edge of stacked-gate structure. After the ion implantation, the photoresistor 532 is stripped.

Figure 5D:
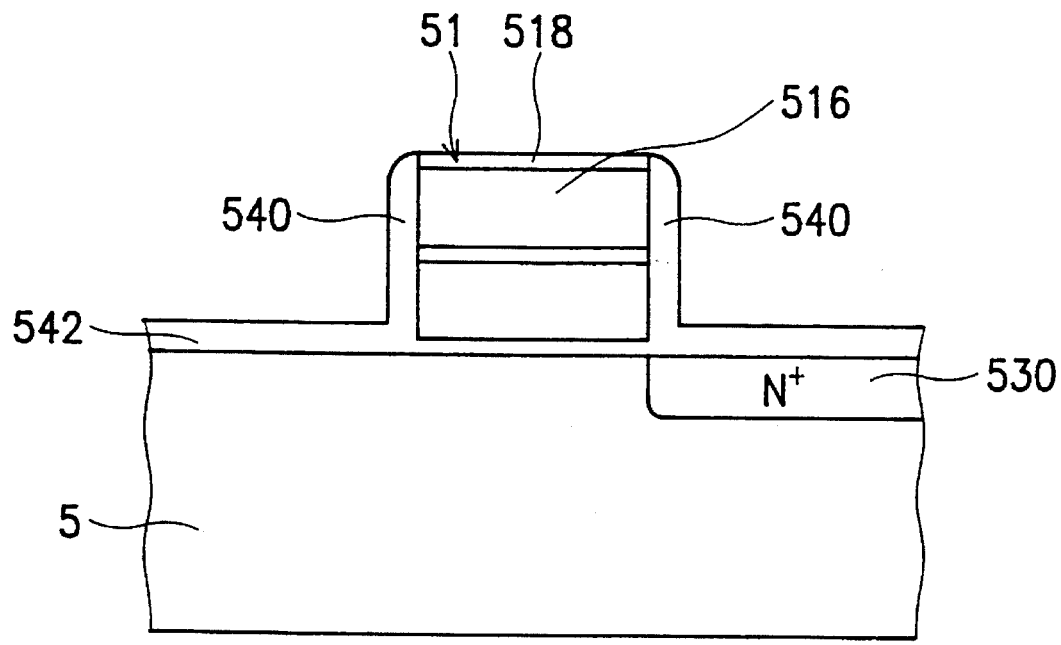

FIG. 5(d) illustrates a cross-sectional side view of the present invention following a fourth processing step. Sidewall insulators 540 are formed on the sidewalls of the stacked-gate structure 51. In this embodiment, these sidewall insulators 540 are formed by a thermal oxidation process growing sidewall oxide along the sidewalls of stacked-gate structure 51, which has been masked by the silicon nitride 518 to prevent oxidation over the second polysilicon 516. In this thermal oxidation process, oxidation also occurs in the tunnel oxide area which is not covered by the stacked-gate structure 51 to form the eventual gate oxide 542 for the isolation transistor. Then, the silicon nitride 518 is selectively etched away.

Figure 5E:
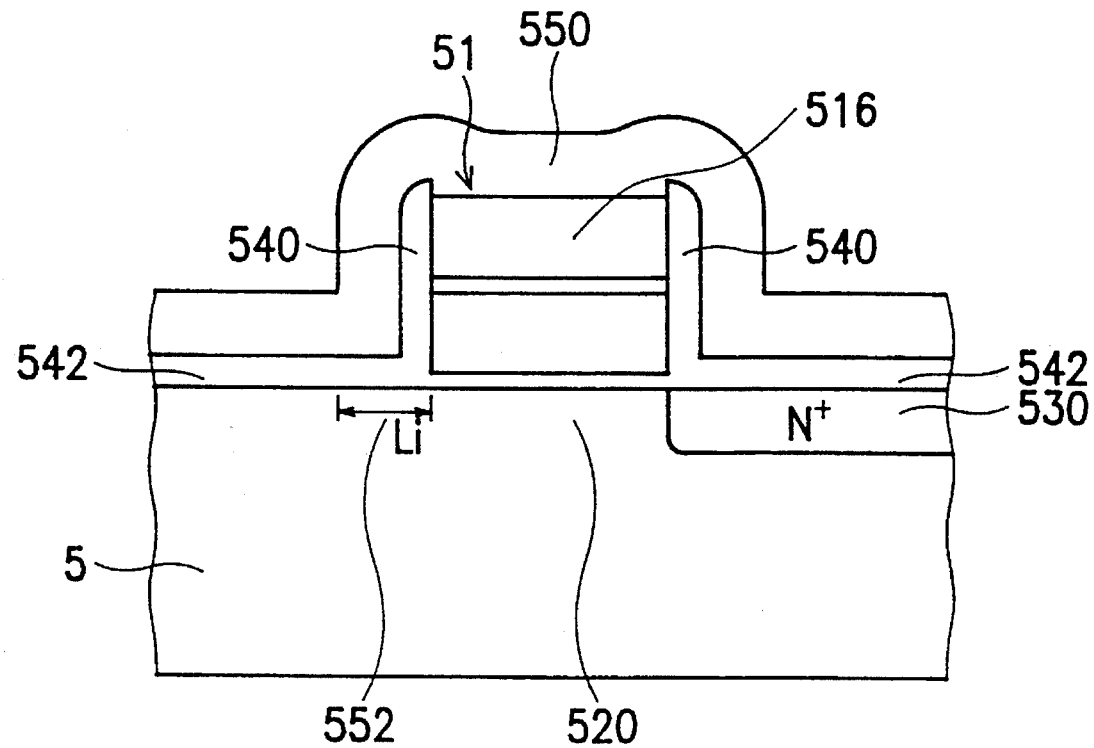

FIG. 5(e) illustrates a cross-sectional side view of the present invention after a fifth processing stage. A third conductive layer 550 such as highly doped polysilicon layer is deposited over the entire structure, i.e. over the upper surface of the second polysilicon 516, the sides of the sidewall oxides 540, and the upper surface of the gate oxide 542. The third polysilicon 550 connects with the second polysilicon 516 to form the common control gate, i.e. word line, for the memory and isolation transistors. The thickness of the third polysilicon 550 which has an excellent processing controllability determines the channel length $L_i$ of the isolation transistor. More specifically, the silicon substrate region 552 underneath the left upright portion of the third polysilicon 550 adjacent to the left sidewall oxide 540 forms the channel of the isolation transistor. Therefore, the channel length $L_i$ can be precisely defined by controlling the deposited thickness of the third polysilicon 550.

Figure 5F:
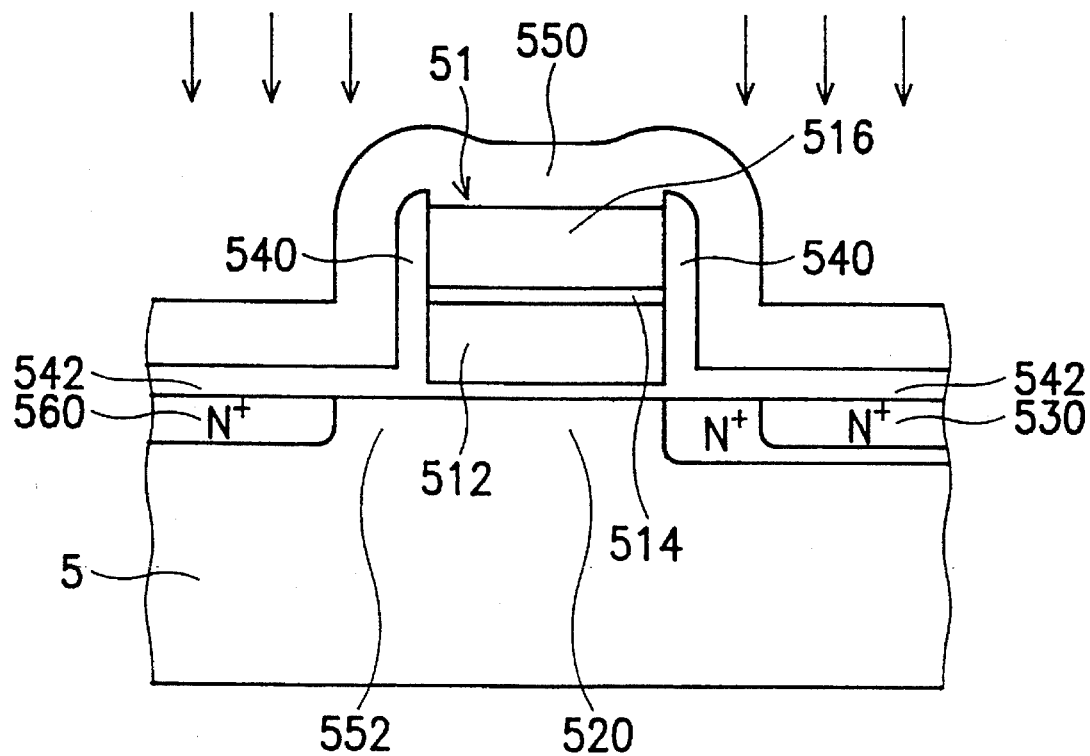

FIG. 5(f) illustrates a cross-sectional side view of the present invention after a sixth processing stage. Following the deposition of the third polysilicon layer 550, the structure is subjected to an ion implantation to form $N^+$ source region 560, typically by use of phosphorous ions at a dosage of between about $1\times10^{14}$ to $5\times10^{15}$ atoms/cm$^2$ and with an energy of between about 100 to 200 KeV. The use of phosphorous as a dopant is merely exemplary, and it is to be understood that alternative dopants known in the art may be utilized. This ion implantation has been masked by the stacked-gate structure 51, sidewall oxides 540, and upright polysilicon portions 550 so that ions will not go into the silicon substrate area underlying these portions. Furthermore, the second polysilicon 516 over the first polysilicon 512 and inter-poly ONO dielectric 514 can protect them from damages during implantation processing at this high energy/dosage. The formed source region 560 has its right edge defined by the left edge of the left upright polysilicon portion 550, and thus is self-aligned with the left edge of the left upright polysilicon portion 550. In this ion implantation, dopant is also diffused into part of the drain region 530, but this will not affect the device operation.

Since the remaining steps in the process, such as contact, metallization, passivation, etc., are standard well known steps in the split-gate flash EEPROM technology, and form no part of the present invention, they will not be further described here.

While the invention has been described in terms of what is presently considered to be the most practical and preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A method for forming a split-gate EEPROM cell including a memory transistor and an isolation transistor, comprising the steps of:

(a) forming a stacked-gate structure for said memory transistor on a face of a substrate, said stacked-gate structure including a tunnel insulating layer, a floating gate layer, an inter-level dielectric layer and a first control gate layer;

(b) forming, at one side of said stacked-gate structure, a diffused drain region into said substrate with one edge of said drain region aligned with the edge of said stacked-gate structure at said one side, (c) forming sidewall insulating layers on the sidewalls of said stacked-gate structure, and forming a gate-insulating layer for said isolation transistor on said substrate;

(d) forming a second control gate layer can formally overlaying said first control gate layer, said sidewall-insulating layers and said gate insulating layer, where said second control gate layer has a first thickness overlying the gate insulating and first control gate layers, and a second greater thickness than said first thickness on the sidewall insulating layers, said thickness being measured in a direction perpendicular to the upper surface of the substrate said second control gate layer connecting with said first control gate layer to form a common control gate for said memory and isolation transistors; and (e) forming, at another side of said stacked-gate structure opposite to said one side, a diffused source region in said substrate with one edge of said source region aligned with the second control gate layer at a point where the thickness of said second control gate layer changes from the second to the first thickness of said second control gate layer, which is formed on the sidewall insulating layer located at said another side of said stacked-gate structure.

2. A method as claimed in claim 1, wherein in the step (c) the formation of said sidewall and gate insulating layers includes the steps of forming an oxidation preventing layer on said first control gate; thermal oxidation to grow said sidewall and gate insulating layers; and removing said oxidation preventing layer.

3. A method as claimed in claim 2, wherein said oxidation preventing layer is a silicon nitride layer.

4. A method as claimed in claim 1, wherein in the step (b) the formation of said drain region includes the steps of forming a mask layer to cover the planned source area and part of said stacked-gate structure and to expose the planned drain area; implanting by ions to form said drain region; and removing said mask layer.

5. A method as claimed in claim 4, wherein said floating-gate layer, first and second control-gate layers are formed from heavily doped polysilicon.

6. A method as claimed in claim 4, wherein said inter-level dielectric layer comprises an oxide-nitride-oxide structure.

7. A method as claimed in claim 4, wherein said tunnel-insulating layer comprises an oxide.

8. A method as claimed in claim 4, wherein said memory transistor is an N-channel floating gate transistor, and wherein said isolation transistor is an N-channel enhancement transistor.

9. A method as claimed in claim 4, wherein said memory transistor is a P-channel floating-gate transistor, and wherein said isolation transistor is a P-channel enhancement transistor.

10. A method for forming a memory cell, comprising the steps of:

forming a stacked-gate structure on a face of a substrate, said stacked-gate structure including a tunnel oxide layer, a polysilicon floating-gate layer, an inter-poly dielectric layer and a first polysilicon gate layer;

forming, at one side of said stacked-gate structure, a diffused-drain region into said substrate with said drain region self-aligned with said stacked-gate structure;

forming a gate oxide layer on said substrate in an area which is not covered by said stacked-gate structure;

forming sidewall insulating layers on the sidewalls of said stacked-gate structure;

forming a second polysilicon gate layer conformally overlaying said first polysilicon gate layer, said sidewall insulating layers and said gate oxide layer, where said second control gate layer has a first thickness overlying the gate insulating and first control gate layers, and a second greater thickness than said first thickness on the sidewall insulating layers, said thickness being measured in a direction perpendicular to the upper surface of the substrate said second polysilicon gate layer connecting with said first polysilicon gate layer to form a common control gate; and forming, at another side of said stacked-gate structure opposite to said one side, a diffused source region in said substrate with said source region self-aligned with the second control gate layer at a point where the thickness of said second control gate layer changes from the second to the first thickness of said second polysilicon gate layer located at said another side of said stacked-gate structure.

11. A method as claimed in claim 10, wherein the formations of said sidewall insulating layer and said gate oxide layer include the steps of forming an oxidation preventing layer on said first polysilicon gate layer; thermal oxidation to grow said sidewall and gate oxide layers; and removing said oxidation preventing layer.

12. A method as claimed in claim 11, wherein said oxidation-preventing layer is a silicon nitride layer.

13. A method as claimed in claim 10, wherein the formation of said drain region includes the steps of forming a mask layer to cover the planned source area and part of said stacked-gate structure and to expose the planned drain area; implanting by ions to form said drain region; and removing said mask layer.

14. A method as claimed in claim 13, wherein said inter-poly dielectric layer comprises an oxide-nitride-oxide structure.

* * * * *